(12) United States Patent
Park

(10) Patent No.: US 12,067,191 B2
(45) Date of Patent: Aug. 20, 2024

(54) TOUCH SENSING DEVICE AND DRIVING METHOD THEREOF

(71) Applicant: LX SEMICON CO., LTD., Daejeon (KR)

(72) Inventor: Sun Young Park, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 142 days.

(21) Appl. No.: 17/852,487

(22) Filed: Jun. 29, 2022

(65) Prior Publication Data

US 2023/0038508 A1 Feb. 9, 2023

(30) Foreign Application Priority Data

Jul. 28, 2021 (KR) .......................... 10-2021-0099051

(51) Int. Cl.
*G06F 3/041* (2006.01)
(52) U.S. Cl.
CPC ...... *G06F 3/04164* (2019.05); *G06F 3/04166* (2019.05)

(58) Field of Classification Search
CPC ............ G06F 3/04164; G06F 3/04166; G06F 3/0443; G06F 3/0446; G06F 3/0412; H10K 59/40
See application file for complete search history.

(56) References Cited

U.S. PATENT DOCUMENTS

2018/0150168 A1* 5/2018 Jung ....................... H03M 1/12

* cited by examiner

*Primary Examiner* — Jonathan A Boyd
(74) *Attorney, Agent, or Firm* — ROTHWELL, FIGG, ERNST & MANBECK, P.C.

(57) ABSTRACT

The disclosure relates to a touch sensing device and a driving method thereof. A touch sensing device includes a touch driving device receiving touch sensing data from a touch sensor during a touch sensing period, a touch controller receiving the touch sensing data from the touch driving device during a display period, and a first bus connecting the touch driving device to the touch controller, wherein the touch driving device transfers the touch sensing data to the touch controller through the first bus during the display period.

18 Claims, 16 Drawing Sheets

FIG. 16

| Data bit number based on line | Line Number | Operating clock number | | | | | | | | | | | Rawdata Dump | |
|---|---|---|---|---|---|---|---|---|---|---|---|---|---|---|
| | | 2 | 4 | 6 | 8 | 10 | 12 | 14 | 16 | 18 | 20 | 22 | efficiency@32bit | efficiency@24bit |
| SCLK, MOSI | 2 | 3 | 6 | 9 | 12 | 15 | 18 | 21 | 24 | 27 | 30 | 33 | 68.75% | 66.67% |
| SCLK, MOSI, MISO | 3 | 5 | 10 | 15 | 20 | 25 | 30 | 35 | | | | | 43.75% | 41.67% | form
TOUCH SENSING DEVICE AND DRIVING METHOD THEREOF

CROSS-REFERENCE TO RELATED APPLICATIONS

This application claims the benefit of the Korean Patent Application No. 10-2021-0099051 filed on Jul. 28, 2021, which is hereby incorporated by reference as if fully set forth herein.

FIELD

The present disclosure relates to a touch sensing device and a driving method thereof.

BACKGROUND

Display apparatuses, which display an image, include liquid crystal display (LCD) apparatuses including liquid crystal, organic light emitting diode (OLED) display apparatuses including an OLED, etc.

Recently, an input method is not limited to a conventional input method such as a button, a keyboard, or a mouse, and a display apparatus (hereinafter referred to as a touch display apparatus) including a touch screen panel for sensing a touch input based on a finger of a user or a stylus pen is being widely used. The touch display apparatus described above includes a touch sensing device.

A touch display driving device for driving the touch display apparatus includes a display driving device which drives a display apparatus and a touch sensing device which detects the occurrence or not of a touch and touch coordinates (or a touch position). In detail, the touch sensing device drives touch sensors (or touch electrodes) to detect touch sensing data and detects touch information including the occurrence or not of a touch or touch coordinates by using the detected touch sensing data.

Particularly, the number of lines connecting a plurality of readout integrated circuits to a touch controller is many, and due to this, the lines may occupy a large area.

SUMMARY

Accordingly, the present disclosure is directed to providing a touch sensing device and a driving method thereof that substantially obviate one or more problems due to limitations and disadvantages of the related art.

An aspect of the present disclosure is directed to providing a touch sensing device, in which an area occupied by lines connecting a plurality of readout integrated circuits to a touch controller is reduced, and a driving method of the touch sensing device.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a touch sensing device including: a touch driving device receiving touch sensing data from a touch sensor during a touch sensing period; a touch controller receiving the touch sensing data from the touch driving device during a display period; and a first bus connecting the touch driving device to the touch controller, wherein the touch driving device transfers the touch sensing data to the touch controller through the first bus during the display period.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 16 is a diagram illustrating the number of operating clocks with respect to the number of data lines of a touch sensing device according to another embodiment of the present disclosure.

DETAILED DESCRIPTION OF THE DISCLOSURE

Figure 1:
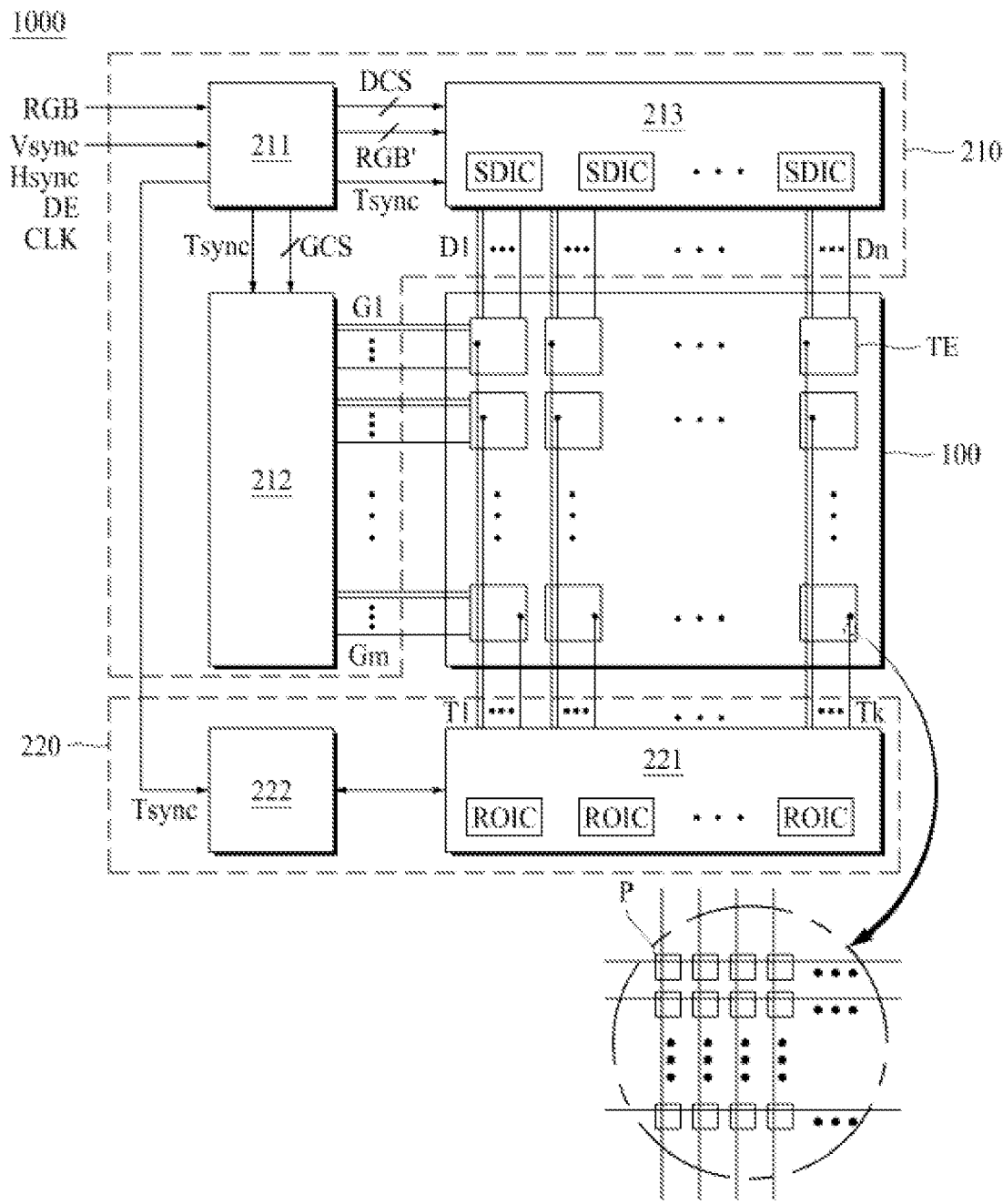
FIG. 1 is a block diagram of a display apparatus including a touch sensing device according to an embodiment of the present disclosure.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Figure 2:
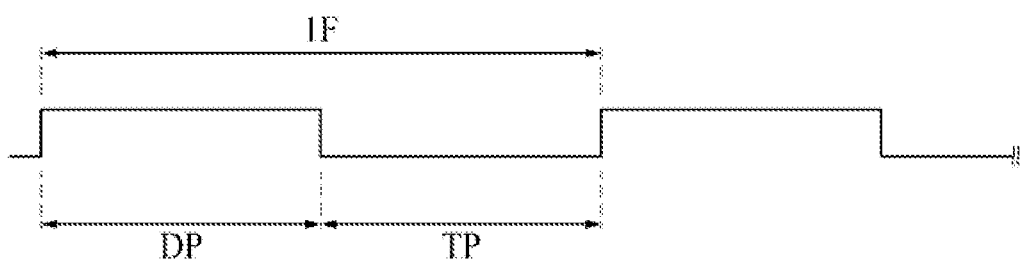
FIG. 2 is a timing diagram illustrating a configuration of one frame of a display apparatus including a touch sensing device according to an embodiment of the present disclosure.
Figure 3:
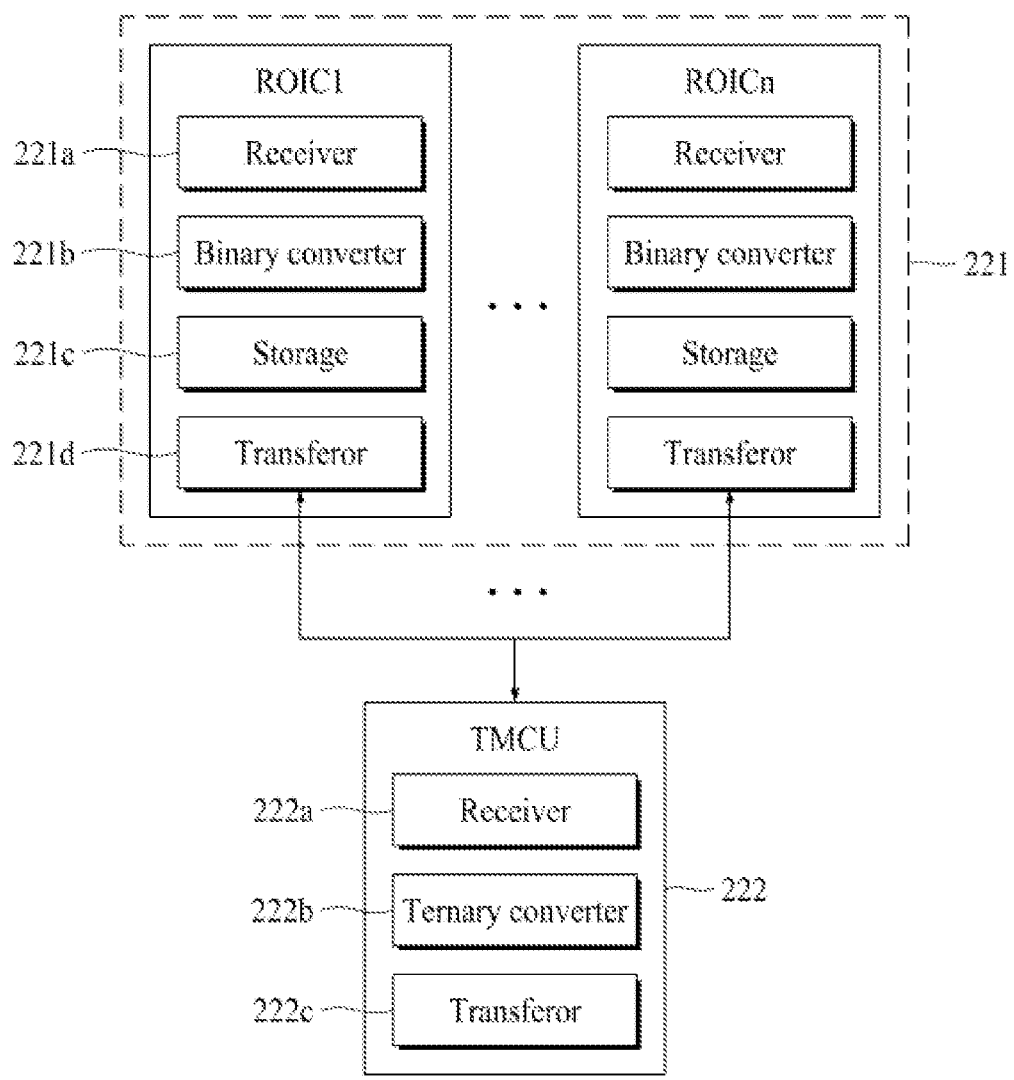
FIG. 3 is a block diagram of a touch sensing device according to an embodiment of the present disclosure.
Figure 4:
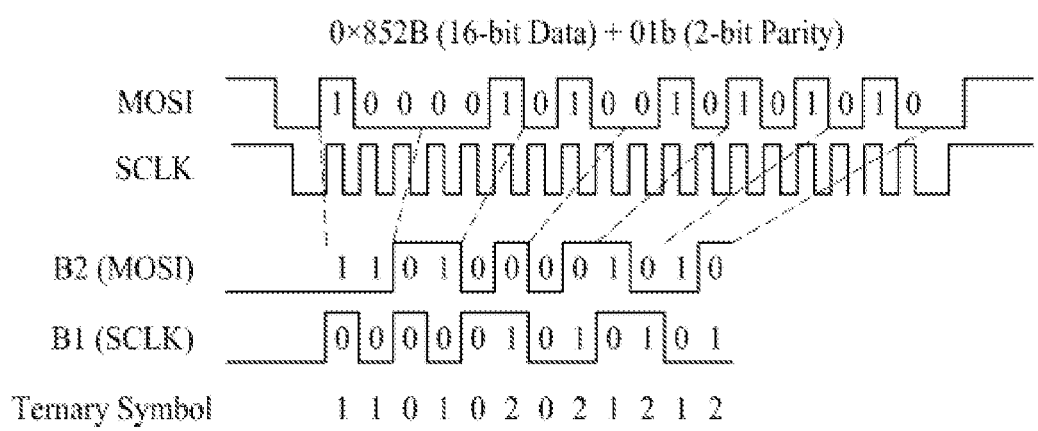
FIG. 4 is a diagram illustrating a correspondence relationship between touch sensing data of a ternary symbol and touch sensing data according to an embodiment of the present disclosure.
Figure 5:
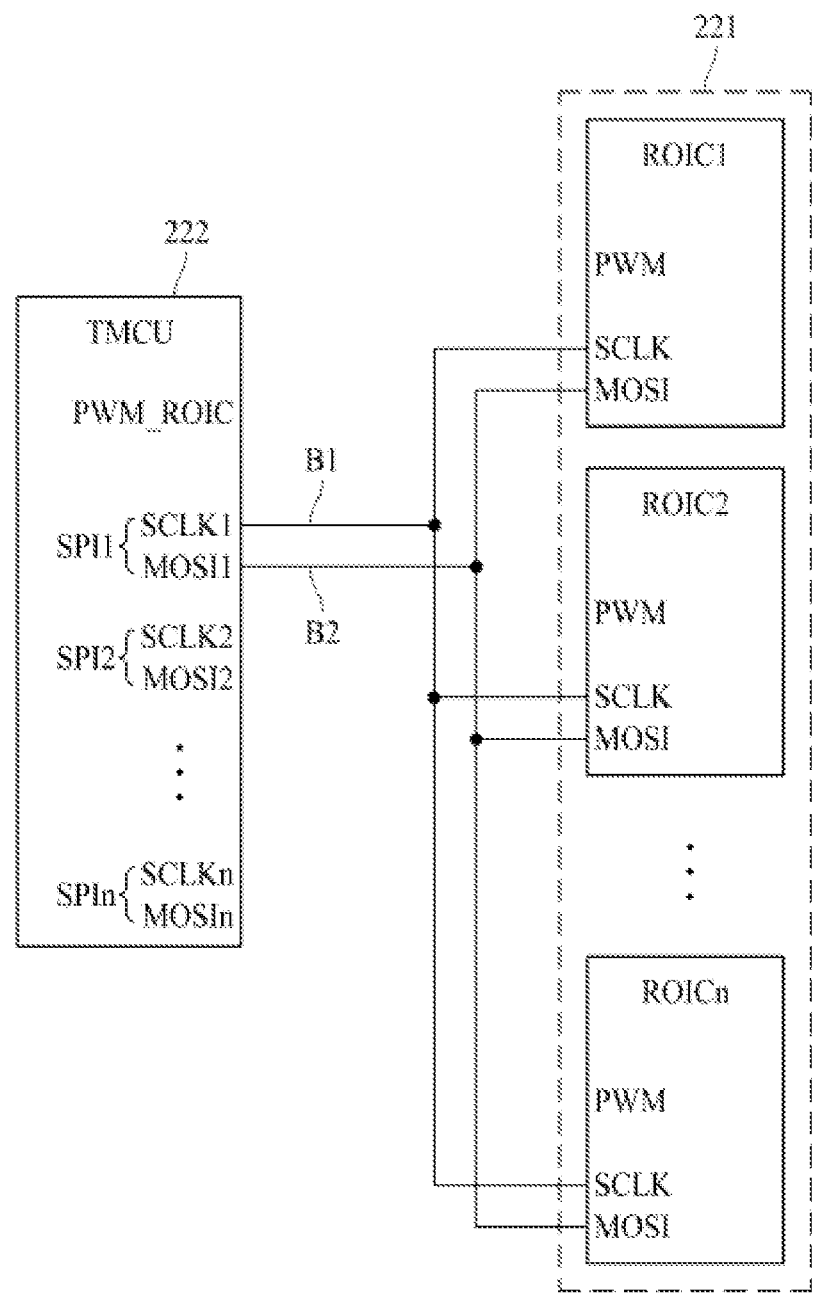
FIG. 5 is a diagram illustrating a connection relationship between a touch driving device and a touch controller according to an embodiment of the present disclosure.

FIG. 1 is a block diagram of a display apparatus 1000 including a touch sensing device according to an embodiment of the present disclosure, and FIG. 2 is a timing diagram illustrating a configuration of one frame of a display apparatus including a touch sensing device according to an embodiment of the present disclosure. FIG. 3 is a block diagram of a touch sensing device according to an embodiment of the present disclosure, and FIG. 4 is a diagram illustrating a correspondence relationship between touch sensing data of a ternary symbol and touch sensing data according to an embodiment of the present disclosure. FIG. 5 is a diagram illustrating a connection relationship between a touch driving device and a touch controller according to an embodiment of the present disclosure.

Referring to FIG. 1, the display apparatus 1000 according to an embodiment of the present disclosure may include a touch display panel 100, a display driving device 210, and a touch sensing device 220.

The display apparatus 1000 may perform a display function and a touch sensing function and may be implemented as a flat display apparatus such as a liquid crystal display (LCD) apparatus or an organic light emitting diode (OLED) display apparatus.

The touch display panel 100, as illustrated in FIG. 2, may operate in a display period DP and a touch sensing period TP. The touch display panel 100 may display an image by using light irradiated from a backlight unit during the display period DP and may perform a function of a touch panel for touch sensing during the touch sensing period TP.

The touch display panel 100 may display an image having a certain gray level or may receive a touch. The touch display panel 100 may be an in-cell touch type display panel using a capacitance type. Alternatively, the touch display panel 100 may be an in-cell touch type display panel using a self-capacitance type or an in-cell touch type display panel using a mutual capacitance type.

The touch display panel 100 may include a plurality of gate lines G1 to Gm, a plurality of data lines D1 to Dn, a plurality of pixels P, a plurality of touch sensors TE, and a plurality of touch lines T1 to Tk.

Each of the plurality of gate lines G1 to Gm may receive a scan pulse in the display period DP. Each of the plurality of data lines D1 to Dn may receive a data signal in the display period DP. The plurality of gate lines G1 to Gm and the plurality of data lines D1 to Dn may be arranged on a substrate to intersect with one another, thereby defining a plurality of pixel areas. Each of the plurality of pixels P may include a thin film transistor (TFT) (not shown) connected to a gate line and a data line adjacent thereto, a pixel electrode (not shown) connected to the TFT, and a storage capacitor (not shown) connected to the pixel electrode.

Each of the plurality of touch sensors TE may perform a function of a touch electrode which senses a touch, or may perform a function of a common electrode of generating an electric field along with the pixel electrode to drive liquid crystal. That is, each of the plurality of touch sensors TE may be used as a touch electrode in the touch sensing period TP and may be used as the common electrode in the display period DP. Accordingly, each of the plurality of touch sensors TE may include a transparent conductive material.

Each of the plurality of touch sensors TE may be used as a self-capacitance type touch sensor in the touch sensing period TP, and thus, should have a size which is greater than a minimum contact size between a touch object and the touch display panel 100. Therefore, each of the plurality of touch sensors TE may have a size corresponding to one or more pixels P. The plurality of touch sensors TE may be arranged at a certain interval along a plurality of horizontal lines and a plurality of vertical lines. The touch sensing device 220 may supply a common voltage to a corresponding touch sensor TE through a corresponding touch line of the plurality of touch lines T1 to Tk in the display period DP. The plurality of touch lines T1 to Tk may be respectively and individually connected to the plurality of touch sensors TE.

The display driving device 210 may allow a data signal to be supplied to the plurality of pixels P included in the touch display panel 100 in the display period DP, and thus, may allow the touch display panel 100 to display an image.

The display driving device 210 may include a timing controller 211, a gate driving device 212, and a data driving device 213.

The timing controller 211 may receive various timing signals including a vertical synchronization signal Vsync, a horizontal synchronization signal Hsync, a data enable signal DE, and a clock signal CLK from an external system (not shown) to generate a gate control signal GCS for controlling the gate driving device 212 and a data control signal DCS for controlling the data driving device 213. Also, the timing controller 211 may receive a video signal RGB from the external system, convert the video signal RGB into an image signal RGB' having a type capable of being processed by the data driving device 213, and output the image signal RGB'.

Moreover, the timing controller 211 may compress an external data enable signal transmitted from a host system on the basis of the display period DP to generate an internal data enable signal iDE. The timing controller 211 may generate a touch synchronization signal Tsync for temporally dividing one frame period 1F into the display period DP and the touch sensing period TP on the basis of a timing of the internal data enable signal and the vertical synchronization signal Vsync. The timing controller 211 may transfer the touch synchronization signal Tsync to the gate driving device 212, the data driving device 213, a touch driving device 221, and a touch controller 222.

The host system may convert digital video data into a format suitable for displaying corresponding video data on the touch display panel 100. The host system may transmit the digital video data and the timing signals to the timing controller 211. The host system may be implemented as one of a television (TV) system, a set top box, a navigation system, a DVD player, a blue-ray player, a personal computer (PC), a home theater system, and a phone system and may receive an input video.

Moreover, the host system may receive touch input coordinates from the touch controller 222 and may execute an application program associated with the received touch input coordinates.

The gate driving device 212 may receive the gate control signal GCS from the timing controller 211 during the display period DP. The gate control signal GCS may include a gate start pulse GSP, a gate shift clock GSC, and a gate output enable signal GOE. The gate driving device 212 may generate a gate pulse (or a scan pulse) synchronized with the data signal on the basis of the received gate control signal GCS and may shift the generated gate pulse to sequentially supply the shifted gate pulse to the gate lines G1 to Gm. To this end, the gate driving device 212 may include a plurality of gate drive integrated circuits (ICs) (not shown). The gate drive ICs may sequentially supply the gate pulse synchronized with the data signal to the gate line G1 to Gm on the basis of control by the timing controller 211 during the display period DP. The gate pulse may swing between a gate high voltage VGH and a gate low voltage VGL.

The gate driving device 212 may not generate the gate pulse during the touch sensing period TP and may supply the gate low voltage VGL to the gate lines G1 to Gm. Therefore, the gate lines G1 to Gm may supply the gate pulse to the TFT of each pixel during the display period DP to sequentially select a data line, to which the data signal is to be applied, in the touch display panel 100 and may maintain the gate low voltage during the touch sensing period TP to prevent an output variation of the touch sensors.

The data driving device 213 may receive the data control signal DCS and the image signal RGB' from the timing controller 211 during the display period DP. The data control signal DCS may include a source start pulse SSP, a source sampling clock SSC, and a source output enable signal SOE. The source start pulse may control a data sampling start timing of each of n source drive ICs (SDIC) configuring the data driving device 213. The source sampling clock may be a clock signal which controls a sampling timing of data in each of the source drive ICs SDIC. The source output enable signal may control an output timing of each of the source drive ICs SDIC.

Moreover, the data driving device 213 may convert the received image signal RGB' into an analog data signal and may supply the analog data signal to pixels P through the plurality of data lines D1 to Dn.

The touch sensing device 220 may sense a touch through the touch sensors TE in the touch sensing period TP. In detail, the touch sensing device 220 may supply a touch driving signal to the touch sensors TE to drive the touch sensor TE, and the touch sensing device 220 may sense a variation of a capacitance which is generated when the touch sensor TE is touched.

When the touch display panel 100 is implemented as a mutual capacitance type, the readout IC ROIC may include a driving circuit, which generates the touch driving signal for driving the touch sensor TE and supplies the touch driving signal to the touch sensors TE through the touch lines T1 to Tk, and a sensing circuit which senses a capacitance variation of the touch sensors TE through the touch lines T1 to Tk to generate touch sensing data.

Alternatively, when the touch display panel 100 is implemented as a self-capacitance type, the readout IC ROIC may supply the touch driving signal to the touch sensors TE by using one circuit and may obtain the touch sensing data from the touch sensors TE.

Referring to FIG. 3, the touch sensing device 220 may include a touch driving device 221 and a touch controller 222.

The touch driving device 221 may drive the touch sensors TE during the touch sensing period TP, and thus, may receive touch sensing data from the touch sensors TE. According to an embodiment of the present disclosure, the touch driving device 221 may convert the received binary-symbol touch sensing data 2TS into ternary-symbol touch sensing data 3TS and may transfer the ternary-symbol touch sensing data 3TS to the touch controller 222.

As illustrated in FIG. 3, the touch driving device 221 may include a plurality of readout ICs ROIC1 to ROICn.

According to an embodiment of the present disclosure, the readout ICs ROIC1 to ROICn may include a receiver 221a, a binary converter 221b, a storage 221c, and a transferor 221d.

The receiver 221a may receive a touch sensing signal generated from the touch sensor TE during the touch sensing period TP and may covert the received touch sensing signal into the binary-symbol touch sensing data 2TS.

The binary converter 221b may convert the binary-symbol touch sensing data 2TS into the ternary-symbol touch sensing data 3TS. At this time, the binary converter 221b may receive the binary-symbol touch sensing data 2TS from the receiver 221a or the below-described storage 221c and may convert the binary-symbol touch sensing data 2TS into the ternary-symbol touch sensing data 3TS. That is, the binary converter 221b may be a ternary encoder. A process of converting the binary-symbol touch sensing data 2TS into the ternary-symbol touch sensing data 3TS will be described below with reference to FIG. 4.

According to an embodiment of the present disclosure, an error detection bit such as a checksum bit, a parity bit, or a cyclic redundancy check (CRC) bit for detecting the occurrence of an error caused by communication may be added to the binary-symbol touch sensing data 2TS received from the touch sensor TE, and error detection bits may be converted into the ternary-symbol touch sensing data 3TS along with the binary-symbol touch sensing data 2TS.

The storage 221c may receive and store the binary-symbol touch sensing data 2TS from the receiver 221a, or may receive or store the ternary-symbol touch sensing data 3TS from the binary converter 221b. Particularly, according to an embodiment of the present disclosure, the readout ICs ROIC1 to ROICn may store the touch sensing data, received from the touch sensor TE, in the storage 221c during the touch sensing period TP and may transfer the touch sensing data, stored in the storage 221c, to the touch controller 222 through the transferor 221d during the display period DP. At this time, as described above, the storage 221c may store the binary-symbol touch sensing data 2TS generated from the receiver 221a, or may store the ternary-symbol touch sensing data 3TS obtained through conversion by the binary converter 221b.

The transferor 221d may receive the ternary-symbol touch sensing data 3TS from the binary converter 221b or the storage 221c and may transfer the ternary-symbol touch sensing data 3TS to the touch controller 222.

According to an embodiment of the present disclosure, the readout ICs ROIC1 to ROICn may include a clock terminal SCLK and a master output terminal MOSI, for transferring or receiving data to or from the touch controller 222.

The touch controller 222 may be connected to the plurality of readout ICs ROIC1 to ROICn and may transfer or receive data by using a serial peripheral interface (SPI).

The touch controller 222 may include a receiver 222a, a ternary converter 222b, and a transferor 222c.

The receiver 222a may receive the ternary-symbol touch sensing data 3TS from the readout ICs ROIC1 to ROICn.

The ternary converter 222b may convert the ternary-symbol touch sensing data 3TS into the binary-symbol touch sensing data 2TS. The ternary converter 222b may be a ternary decoder.

The transferor 222c may analyze the binary-symbol touch sensing data 2TS obtained through conversion by the ternary converter 222b by using a predetermined touch recognition algorithm to calculate coordinate information about a touch input position. The transferor 222c may transfer the calculated coordinate information about the touch input position to the external host system.

According to an embodiment of the present disclosure, the touch controller 222 may include a first clock terminal SCLK1 and a first mater output terminal MOSI1, for transferring or receiving data to or from the touch driving device 221.

According to an embodiment of the present disclosure, the binary-symbol touch sensing data 2TS and the ternary-symbol touch sensing data 3TS obtained through conversions by the binary converter 221b of each of the readout ICs ROIC1 to ROICn and the ternary converter 222b of the touch controller 222 may have a correspondence relationship shown in the following Table 1. In detail, as listed in the following Table 1, a binary-symbol touch sensing data "100001010010101010" may be divided into (100), (001), (010), (010), (101), and (010) and the divided touch sensing data may be converted into (11), (01), (02), (02), (12), and (12) which are ternary symbols, and thus, ternary-symbol touch sensing data may be converted into first and second ternary-symbol touch sensing data 3TS1 and 3TS2 which are divided into bits. In this case, the first and second ternary-symbol touch sensing data 3TS1 and 3TS2 may each be "0000010101" and "1101000010". The first ternary-symbol touch sensing data 3TS1 may be transferred to the touch controller 222 through a first bus B1, and simultaneously, the second ternary-symbol touch sensing data 3TS2 may be transferred to the touch controller 222 through a second bus B2.

TABLE 1

| Binary Symbol | | | | Ternary Symbol | | |
|---|---|---|---|---|---|---|
| B2 | B1 | B0 | Decimal | First Symbol | Second Symbol | Symbol Pair |
| 0 | 0 | 0 | 0 | 0 | 0 | 0, 0 |
| 0 | 0 | 1 | 1 | 0 | 1 | 0, 1 |
| 0 | 1 | 0 | 2 | 0 | 2 | 0, 2 |
| 0 | 1 | 1 | 3 | 1 | 0 | 1, 0 |
| 1 | 0 | 0 | 4 | 1 | 1 | 1, 1 |
| 1 | 0 | 1 | 5 | 1 | 2 | 1, 2 |
| 1 | 1 | 0 | 6 | 2 | 0 | 2, 0 |
| 1 | 1 | 1 | 7 | 2 | 1 | 2, 1 |

As described above, an error detection bit such as a checksum bit, a parity bit, or a CRC bit for detecting the occurrence of an error caused by communication may be added to the binary-symbol touch sensing data 2TS received from the touch sensor TE.

In FIG. 4 and Table 1, a correspondence relationship between the binary-symbol touch sensing data 2TS and the first and second ternary-symbol touch sensing data 3TS1 and 3TS2 may be shown, but embodiments of the present disclosure are not limited thereto and the binary-symbol touch sensing data 2TS may correspond to three pieces of ternary-symbol touch sensing data 3TS1, 3TS2, and 3TS3.

According to the present disclosure, as illustrated in FIG. 5, the plurality of readout ICs ROIC1 to ROICn may share at least one of the first and second buses B1 and B2, and the plurality of readout ICs ROIC1 to ROICn may be connected to the touch controller 222 through at least one, which are shared, of the first and second buses B1 and B2. Accordingly, the plurality of readout ICs ROIC1 to ROICn may be connected to the touch controller 222 through at least one bus having a multi-point or a multi-drop structure.

According to the present disclosure, because a plurality of readout ICs share one bus and communicate with a touch controller by using the shared bus, the number of buses connecting the plurality of readout ICs to the touch controller may be reduced, and thus, an area occupied by the buses connecting the plurality of readout ICs to the touch controller may be reduced.

As illustrated in FIG. 5, the clock terminal SCLK of each of the plurality of readout ICs ROIC1 to ROICn may be connected to a first clock terminal SCLK1 of the touch controller 222 through the first bus B1, and the master output terminal MOSI of each of the plurality of readout ICs ROIC1 to ROICn may be connected to a first master output terminal MOSI1 of the touch controller 222 through the second bus B2.

According to an embodiment of the present disclosure, the first and second buses B1 and B2 may connect the touch controller 222 to the readout ICs ROIC1 to ROICn in a multi-point structure, and thus, the number of lines connecting the touch controller 222 to the readout ICs ROIC1 to ROICn may be reduced, thereby decreasing an area occupied by lines between the touch controller 222 and the readout ICs ROIC1 to ROICn.

In the above-described embodiment, it is illustrated that the source drive IC SDIC and the readout ICs ROIC1 to ROICn are implemented as separate elements, but the source drive IC SDIC and the readout ICs ROIC1 to ROICn may be implemented as a type integrated into one chip.

Hereinafter, a driving method of a touch sensing device according to an embodiment of the present disclosure will be described in detail with reference to FIGS. 6 to 11.

Figure 6:
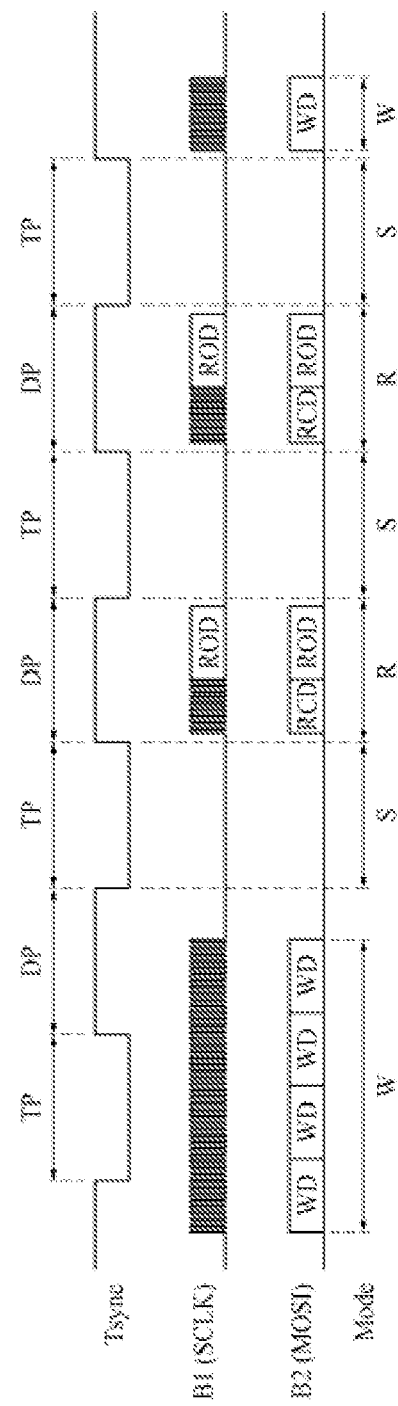
FIG. 6 is a timing diagram of a signal of a touch sensing device according to an embodiment of the present disclosure.
Figure 7:
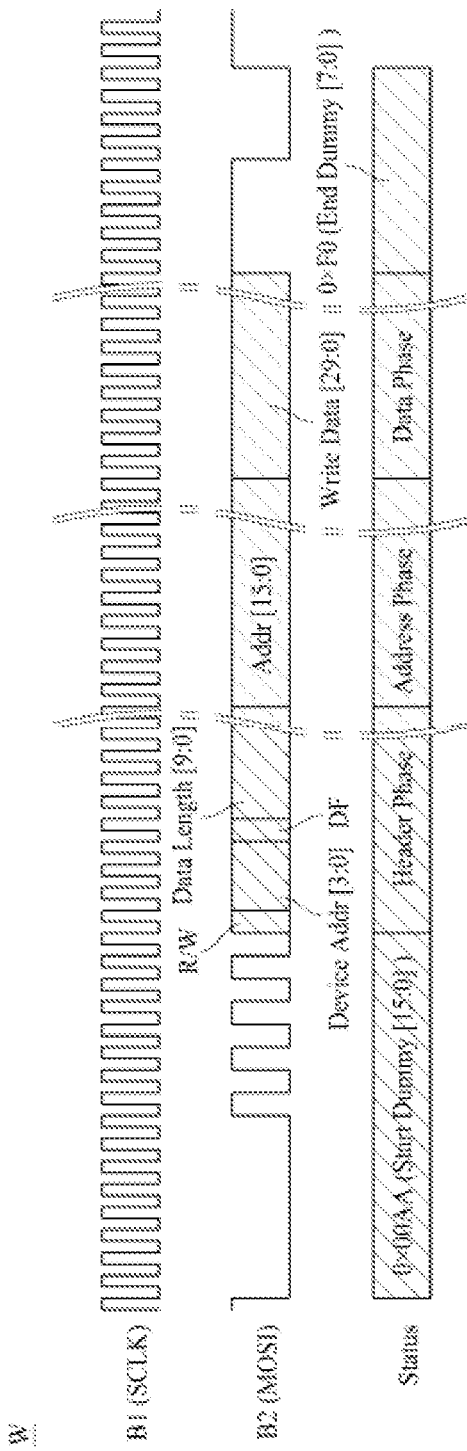
FIG. 7 is a timing diagram in a write mode of a touch sensing device according to an embodiment of the present disclosure.
Figure 8:
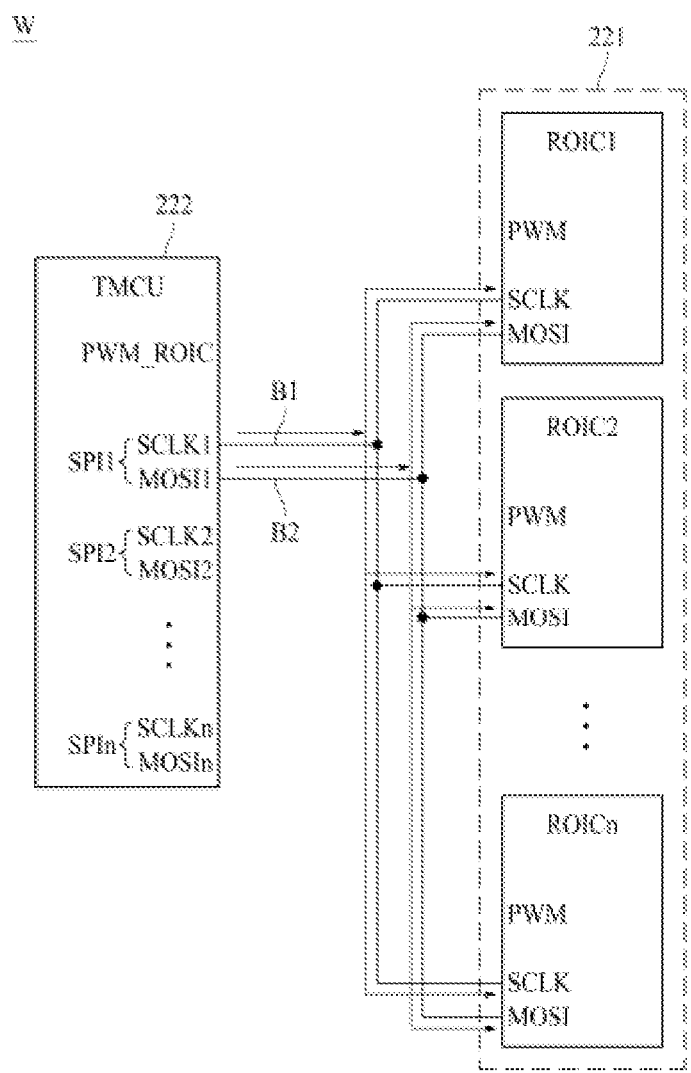
FIG. 8 is a diagram illustrating a data transfer direction in a write mode of a touch sensing device according to an embodiment of the present disclosure.
Figure 9:
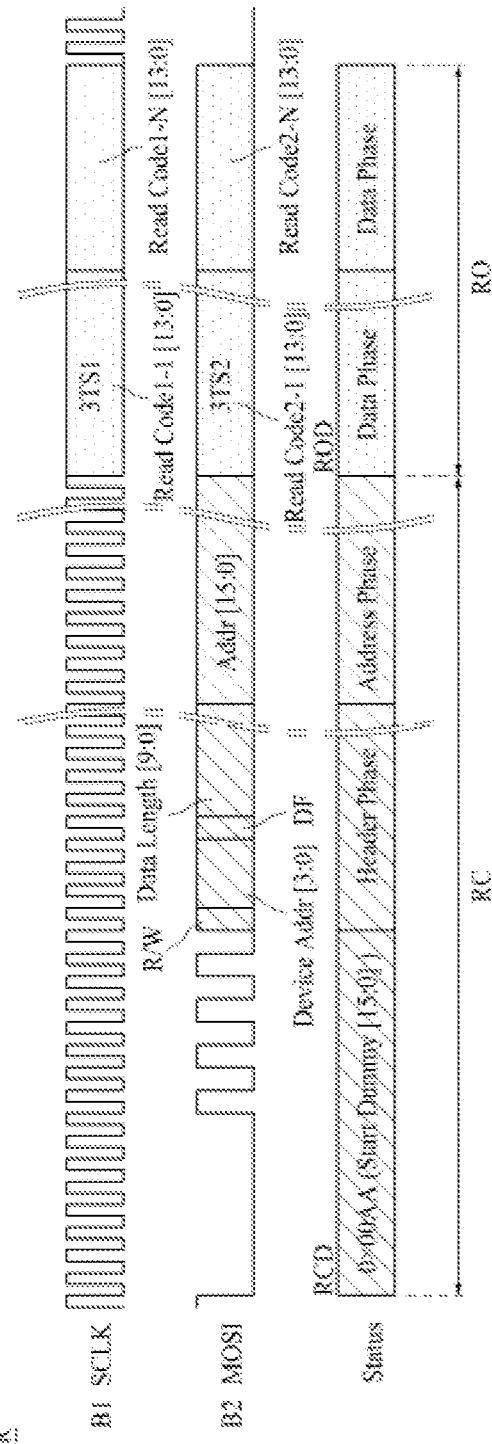
FIG. 9 is a timing diagram in a read mode of a touch sensing device according to an embodiment of the present disclosure.
Figure 10:
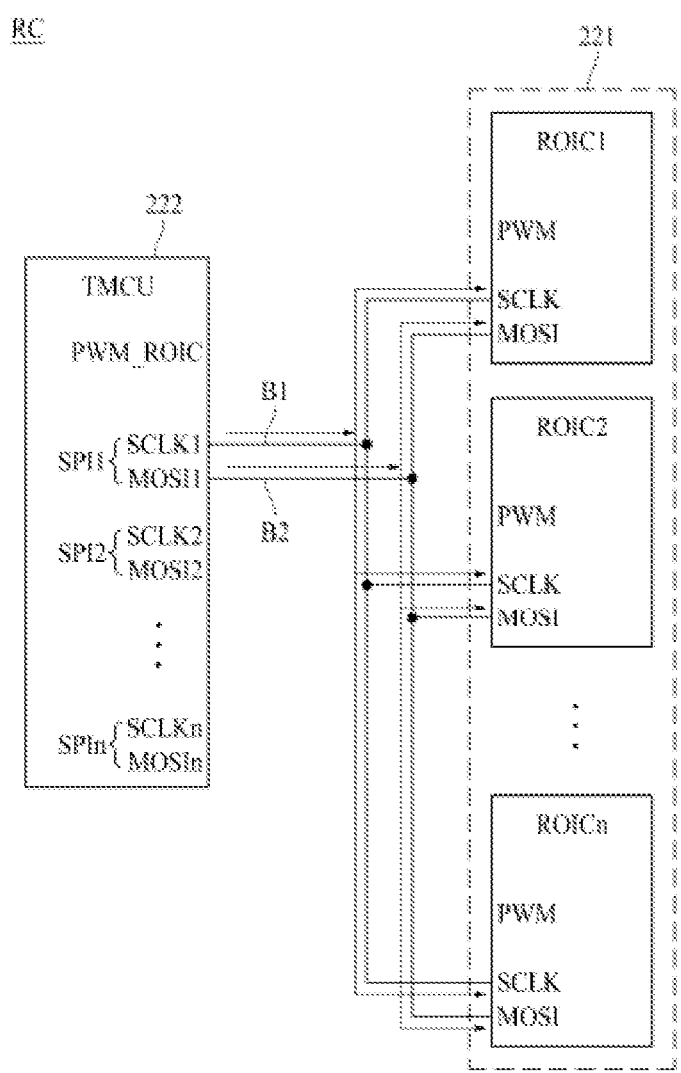
FIG. 10 is a diagram illustrating a data transfer direction in a read request mode of a touch sensing device according to an embodiment of the present disclosure.
Figure 11:
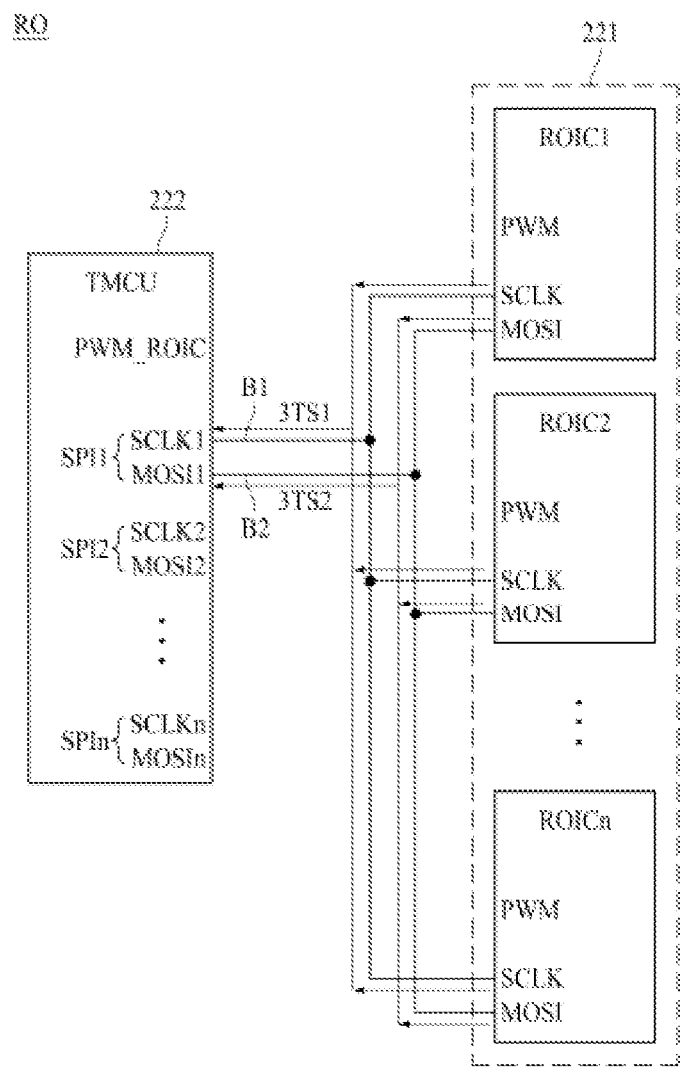
FIG. 11 is a diagram illustrating a data transfer direction in a read operation mode of a touch sensing device according to an embodiment of the present disclosure.

FIG. 6 is a timing diagram of a signal of a touch sensing device according to an embodiment of the present disclosure, and FIG. 7 is a timing diagram in a write mode of a touch sensing device according to an embodiment of the present disclosure. FIG. 8 is a diagram illustrating a data transfer direction in a write mode of a touch sensing device according to an embodiment of the present disclosure, and FIG. 9 is a timing diagram in a read mode of a touch sensing device according to an embodiment of the present disclosure. FIG. 10 is a diagram illustrating a data transfer direction in a read request mode of a touch sensing device according to an embodiment of the present disclosure, and FIG. 11 is a diagram illustrating a data transfer direction in a read operation mode of a touch sensing device according to an embodiment of the present disclosure.

Referring to FIG. 6, as described above, a touch synchronization signal Tsync may temporally divide one frame period into a display period DP and a touch sensing period TP. For example, when the touch synchronization signal Tsync is logic low, this may be classified as a touch sensing period TP, and when the touch synchronization signal Tsync is logic high, this may be classified as a display period DP.

According to an embodiment of the present disclosure, a touch driving device 221 and a touch controller 222 may operate in a write mode W, a sensing mode S, or a read mode R.

During the touch sensing period TP, the touch driving device 221 and the touch controller 222 may operate in the write mode W or the sensing mode S.

In the write mode W, the touch driving device 221 may receive write data WD such as setting data or initialization data from the touch controller 222. Accordingly, the touch driving device 221 may be initialized by the write data WD, or a setting may be changed.

In the write mode W, the touch controller 222 may transfer data to the touch driving device 221 by using the first and second buses B1 and B2. That is, as illustrated in FIG. 7, in the write mode W, the first bus B1 may be used in transferring a clock, and the second bus B2 may be used in transferring the write data. In this case, the write data WD may include a start dummy, a header phase, an address phase, a write data phase, and an end dummy. The start dummy may be a start signal and may include start data representing that an operation of the write mode W starts, the header phase may include mode data representing the read mode R or the write mode W, device address data representing an address of a device which transfers data, and length data representing a length of data which is to be transferred. The address phase may include address data representing an address of a device which receives data, and the write data phase may include data which is to be input. Also, the end dummy may be an end signal and may include end data representing that an operation of the write mode W ends.

Particularly, the touch driving device 221 and the touch controller 222 according to an embodiment of the present disclosure may not use a chip selection terminal, and thus, the write data WD transferred through the second bus B2 may include the start dummy and the end dummy. Accordingly, the number of lines connecting the touch controller 222 to the readout ICs ROIC1 to ROICn may be reduced, and thus, an area occupied by lines between the touch controller 222 and the readout ICs ROIC1 to ROICn may decrease.

As illustrated in FIGS. 7 and 8, in the write mode W, each of the readout ICs ROIC1 and ROIC2 to ROICn of the touch driving device 221 may receive the clock data through the first bus B1 and may receive the write data WD through the second bus B2.

In the sensing mode S, the touch driving device 221 may receive and store a touch sensing signal from the touch sensor TE. In detail, the readout ICs ROIC1 to ROICn of the touch driving device 221 may receive the touch sensing signal from the touch sensor TE and may convert the received touch sensing signal into binary-symbol touch sensing data 2TS. The touch driving device 221 may store the binary-symbol touch sensing data 2TS in the storage 221c, or may convert the binary-symbol touch sensing data 2TS into ternary-symbol touch sensing data 3TS and may store the ternary-symbol touch sensing data 3TS in the storage 221c.

During the display period DP, the touch driving device 221 and the touch controller 222 may operate in the write mode W or the read mode R. As illustrated in FIG. 9, the read mode R may include a read request mode RC and a read operation mode RO. That is, the touch driving device 221 and the touch controller 222 may operate in the write mode W, the read request mode RC, or the read operation mode RO.

In the write mode W, the touch driving device 221 and the touch controller 222 may operate identically to the write mode W during the touch sensing period TP described above. In this case, as illustrated in FIG. 6, the write mode W during the display period DP may operate successively to the write mode W during the touch sensing period TP, and the write mode W during the touch sensing period TP may operate successively to the write mode W during the display period DP.

In the read request mode RC, the touch controller 222 may request touch sensing data from the touch driving device 221 by using the first and second buses B1 and B2. That is, as illustrated in FIG. 9, in the read request mode RC, the first bus B1 may be used in transferring a clock, and the second bus B2 may be used in transferring read request data RCD.

In the read request mode RC, each of the readout ICs ROIC1 to ROICn of the touch driving device 221 may receive clock data through the first bus B1 and may receive the read request data RCD through the second bus B2.

The read request data RCD may include a start dummy, a header phase, and an address phase. The start dummy may be a start signal and may include start data representing that an operation of the read mode R starts, the header phase may include mode data representing the read mode R or the write mode W, device address data representing an address of a device which transfers data, and length data representing a length of data which is to be transferred. The address phase may include address data representing an address of a device which receives data.

As illustrated in FIGS. 9 and 10, in the read request mode RC, the touch controller 222 may transfer the clock to the readout ICs ROIC1 to ROICn through the first bus B1 and may transfer the read request data RCD through the second bus B2.

The touch driving device 221 and the touch controller 222 according to an embodiment of the present disclosure may not use a chip selection terminal, and thus, the read request data RCD transferred through the second bus B2 may include the start dummy. Accordingly, the number of lines connecting the touch controller 222 to the readout ICs ROIC1 to ROICn may be reduced, and thus, an area occupied by lines between the touch controller 222 and the readout ICs ROIC1 to ROICn may decrease.

In the read operation mode RO, the touch driving device 221 may transfer ternary-symbol touch sensing data 3TS, including first ternary-symbol touch sensing data 3TS1 and second ternary-symbol touch sensing data 3TS2, to the touch controller 222 by using the first and second buses B1 and B2. That is, as illustrated in FIG. 9, in the read operation mode RO, the first and second buses B1 and B2 may be used in transferring the ternary-symbol touch sensing data 3TS including the first ternary-symbol touch sensing data 3TS1 and the second ternary-symbol touch sensing data 3TS2. In detail, as illustrated in FIGS. 9 and 11, in the read operation mode RO, each of the readout ICs ROIC1 to ROICn of the touch driving device 221 may transfer the first ternary-symbol touch sensing data 3TS1 to the touch controller 222 through the first bus B1, and simultaneously, may transfer the second ternary-symbol touch sensing data 3TS2 to the touch controller 222 through the second bus B2.

Moreover, the first bus B1 provided with the clock in the write mode W and the read request mode RC may not be provided with the clock in the read operation mode RO, and thus, electromagnetic interference noise caused by the clock may be prevented.

Hereinafter, a driving method of a touch sensing device according to another embodiment of the present disclosure will be described in detail with reference to FIGS. 12 to 15.

Figure 12:
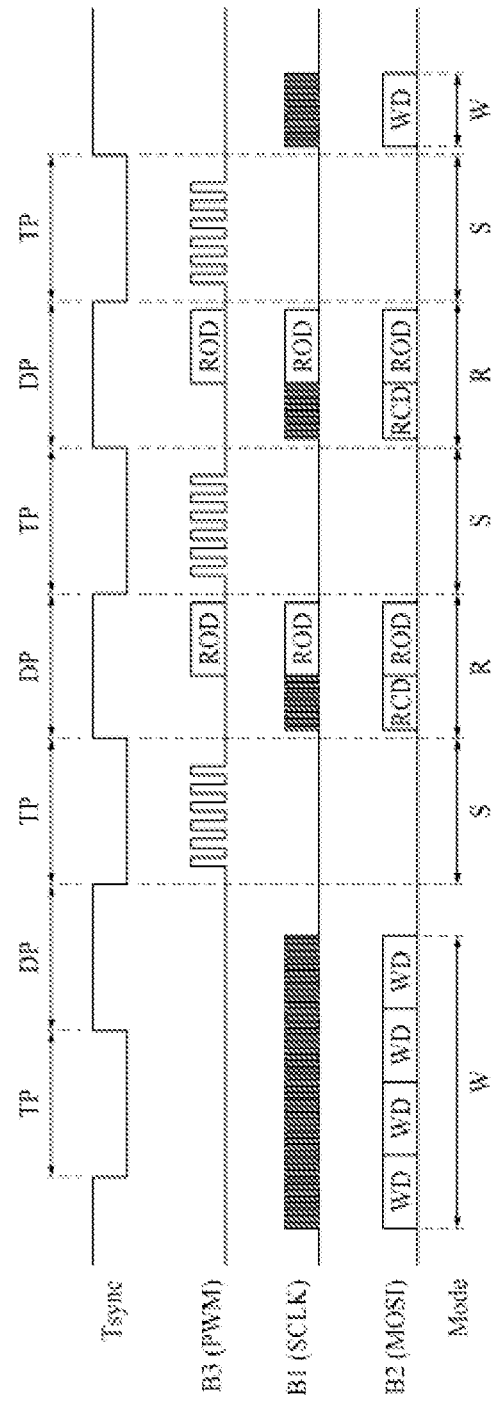
FIG. 12 is a timing diagram of a signal of a touch sensing device according to another embodiment of the present disclosure.
Figure 13:
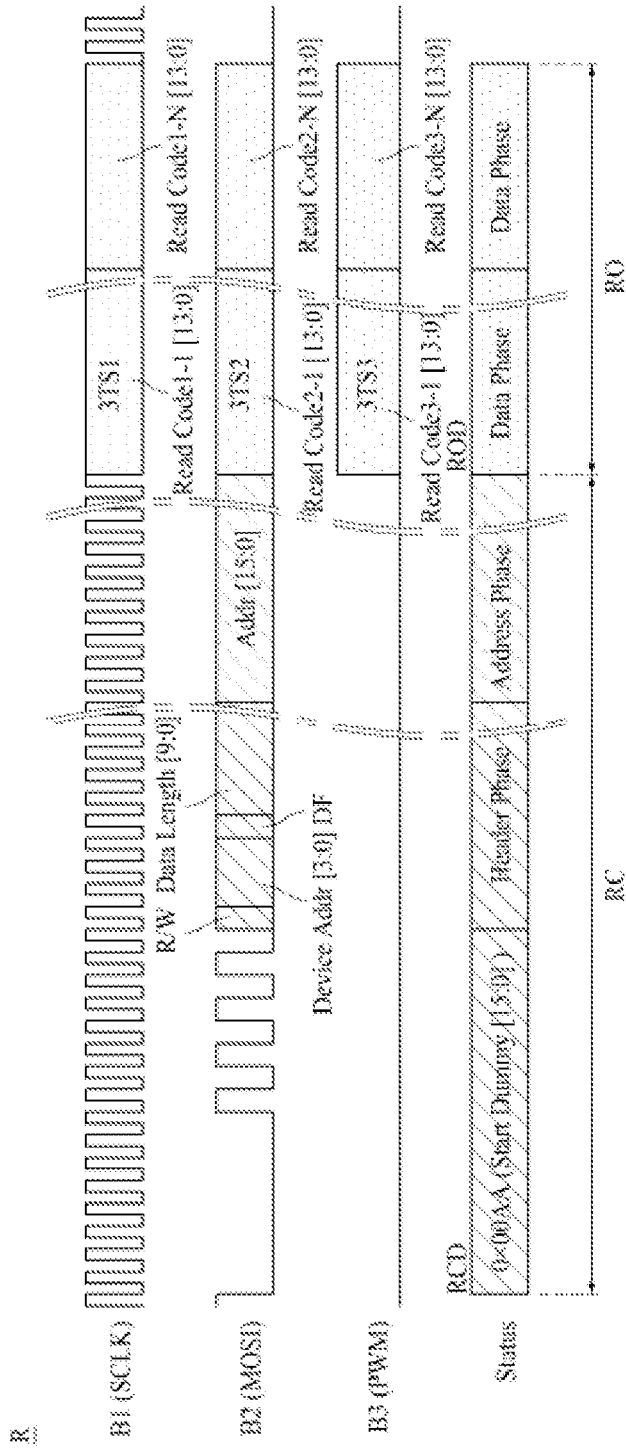
FIG. 13 is a timing diagram in a read mode of a touch sensing device according to another embodiment of the present disclosure.
Figure 14:
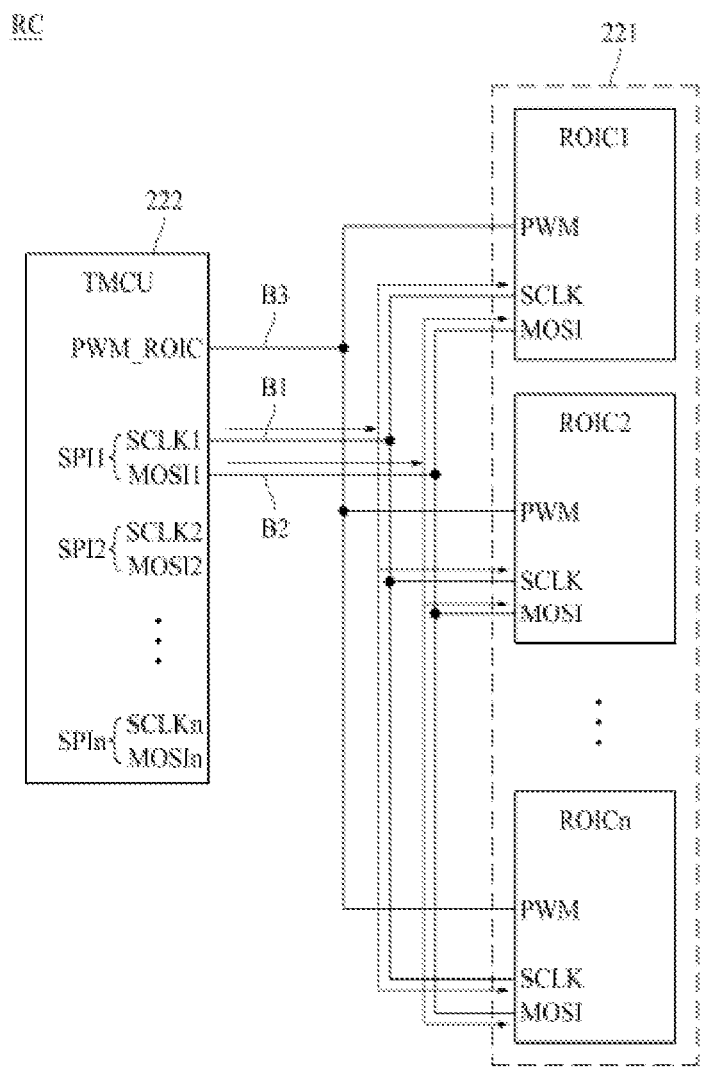
FIG. 14 is a diagram illustrating a data transfer direction in a read request mode of a touch sensing device according to another embodiment of the present disclosure.
Figure 15:
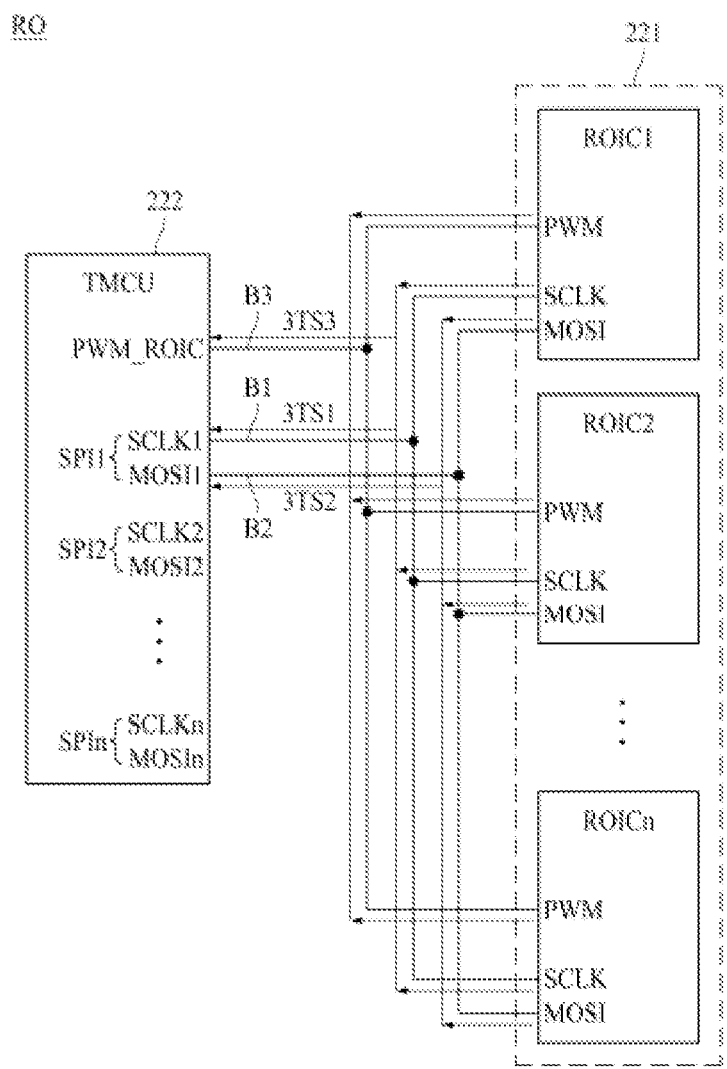
FIG. 15 is a diagram illustrating a data transfer direction in a read operation mode of a touch sensing device according to another embodiment of the present disclosure.

FIG. 12 is a timing diagram of a signal of a touch sensing device according to another embodiment of the present disclosure, and FIG. 13 is a timing diagram in a read mode of a touch sensing device according to another embodiment of the present disclosure. FIG. 14 is a diagram illustrating a data transfer direction in a read request mode of a touch sensing device according to another embodiment of the present disclosure, and FIG. 15 is a diagram illustrating a data transfer direction in a read operation mode of a touch sensing device according to another embodiment of the present disclosure.

During a touch sensing period TP, a touch driving device 221 and a touch controller 222 may operate in a write mode W or a sensing mode S.

In the write mode W, the touch driving device 221 may receive write data WD such as setting data or initialization data from the touch controller 222. Accordingly, the touch driving device 221 may be initialized by the write data WD, or a setting may be changed.

In the sensing mode S, as illustrated in FIG. 12, the touch driving device 221 may receive a touch modulation signal from the touch controller 222 through a third bus B3 and may receive a touch sensing signal from a touch sensor TE. In detail, the touch driving device 221 may receive the touch sensing signal from the touch sensor TE by using the touch modulation signal received from the touch controller 222 through the third bus B3.

During the display period DP, the touch driving device 221 and the touch controller 222 may operate in the write mode W or the read mode R. The read mode R may include a read request mode RC and a read operation mode RO, and the touch driving device 221 and the touch controller 222 may operate in the write mode W, the read request mode RC, or the read operation mode RO.

In the write mode W, the touch driving device 221 and the touch controller 222 may operate identically to the write mode W during the touch sensing period TP described above. In this case, as illustrated in FIG. 12, the write mode W during the display period DP may operate successively to the write mode W during the touch sensing period TP, and the write mode W during the touch sensing period TP may operate successively to the write mode W during the display period DP.

In the read request mode RC, the touch controller 222 may request touch sensing data from the touch driving device 221 by using the first and second buses B1 and B2. That is, as illustrated in FIG. 13, in the read request mode RC, the first bus B1 may be used in transferring a clock, and the second bus B2 may be used in transferring read request data RCD. In detail, as illustrated in FIGS. 12 and 13, in the read request mode RC, the touch controller 222 may transfer the clock to the readout ICs ROIC1 to ROICn through the first bus B1 and may transfer the read request data RCD through the second bus B2. In the read request mode RC, each of the readout ICs ROIC1 to ROICn of the touch driving device 221 may receive clock data through the first bus B1 and may receive the read request data RCD through the second bus B2.

According to an embodiment of the present disclosure, the readout ICs ROIC1 to ROICn may include a clock terminal SCLK, a master output terminal MOSI, and a modulation signal terminal PWM so as to transfer or receive data to or from the touch controller 222, and the touch controller 222 may include a modulation signal terminal PWM_ROIC, a first clock terminal SCLK1, and a first master output terminal MOSI1 so as to transfer or receive data to or from the touch driving device 221. The clock terminal SCLK of each of the readout ICs ROIC1 to ROICn may be connected to the first clock terminal SCLK1 of the touch controller 222 through the first bus B1, the master output terminal MOSI of each of the readout ICs ROIC1 to ROICn may be connected to the first master output terminal MOSI1 of the touch controller 222 through the second bus B2, and the modulation signal terminal PWM of each of the readout ICs ROIC1 to ROICn may be connected to the modulation signal terminal PWM_ROIC of the touch controller 222 through the third bus B3.

In the read operation mode RO, the touch driving device 221 may transfer ternary-symbol touch sensing data 3TS, including first to third ternary-symbol touch sensing data 3TS1 to 3TS3, to the touch controller 222 by using the first to third buses B1 to B3. That is, as illustrated in FIGS. 13 and 15, in the read operation mode RO, the first to third buses B1 to B3 may be used in transferring the ternary-symbol touch sensing data 3TS including the first to third ternary-symbol touch sensing data 3TS1 to 3TS3. That is, as illustrated in FIG. 15, in the read operation mode RO, each of the readout ICs ROIC1 to ROICn of the touch driving device 221 may simultaneously transfer, to the touch controller 222, the first ternary-symbol touch sensing data 3TS1 by using the first bus B1, the second ternary-symbol touch sensing data 3TS2 by using the second bus B2, and the third ternary-symbol touch sensing data 3TS3 by using the third bus B3.

Moreover, the first bus B1 provided with the clock in the write mode W and the read request mode RC may not be provided with the clock in the read operation mode RO, and thus, electromagnetic interference noise caused by the clock may be prevented.

Hereinafter, a transfer speed according to embodiments of the present disclosure will be described in detail with reference to FIG. 16.

FIG. 16 is a diagram illustrating the number of operating clocks with respect to the number of data lines of a touch sensing device according to another embodiment of the present disclosure.

According to an embodiment of the present disclosure, the first and second ternary-symbol touch sensing data 3TS1 and 3TS2 or the first to third ternary-symbol touch sensing data 3TS1 to 3TS3 may be simultaneously transferred, and thus, a data transfer speed between the touch driving device 221 and the touch controller 222 may be enhanced. As illustrated in FIG. 16, when the number of buses through which the touch sensing data is transferred is 2, 33-bit data may be transferred during 22 clocks, and when the number of buses through which data is transferred is 3, 35-bit data may be transferred during 14 clocks. Comparing with a case where the number of buses through which data is transferred is 1, when the number of buses through which data is transferred is 2, 32-bit data may be transferred based on 68.75% clock number, and when the number of buses through which data is transferred is 3, 32-bit data may be transferred based on 43.75% clock number.

As described above, as in the present disclosure, when the number of buses through which data is transferred increases, the number of clocks consumed for transferring data of the same bit may decrease, and a data transfer speed may increase.

According to an embodiment of the present disclosure, ternary-symbol touch sensing data of two or more bits may be transferred by using a bus provided with the clock in transferring the touch sensing data, and thus, data may be more quickly transferred.

According to the present disclosure, because a plurality of readout ICs share one bus and communicate with a touch controller by using the shared bus, the number of buses connecting the plurality of readout ICs to the touch controller may be reduced, and thus, an area occupied by the buses connecting the plurality of readout ICs to the touch controller may be reduced.

Moreover, a bus provided with a clock in the write mode and the read request mode may not be provided with the clock in the read operation mode, and thus, electromagnetic interference noise caused by the clock may be prevented.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

In addition, at least a part of the methods described herein may be implemented using one or more computer programs or components. These components may be provided as a series of computer instructions through a computer-readable medium or a machine-readable medium, which includes volatile and non-volatile memories. The instructions may be provided as software or firmware and may be entirely or partially implemented in a hardware configuration such as application specific integrated circuits (ASICs), field programmable gate arrays (FPGAs), digital signal processors (DSPs), or other similar devices. The instructions may be configured to be executed by one or more processors or other hardware components, and when one or more processors or other hardware components execute the series of computer instructions, one or more processors or other hardware components may entirely or partially perform the methods and procedures disclosed herein.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A touch sensing device comprising:
a touch driving device configured to receive touch sensing data from a touch sensor during a touch sensing period;
a touch controller configured to receive the touch sensing data from the touch driving device during a display period; and
a first bus connecting the touch driving device to the touch controller,
wherein the touch driving device is configured to transfer the touch sensing data to the touch controller through the first bus during the display period, and
wherein the touch driving device is configured to convert the touch sensing data into ternary-symbol touch sensing data.

2. The touch sensing device of claim 1, wherein the touch driving device is configured to store the received touch sensing data during the touch sensing period and transfer the stored touch sensing data to the touch controller during the display period.

3. The touch sensing device of claim 1, further comprising a second bus connecting the touch driving device to the touch controller, wherein
the touch driving device comprises a plurality of readout integrated circuits, and
the plurality of readout integrated circuits shares at least one of the first and second buses is connected to the touch controller through the shared at least one bus.

4. The touch sensing device of claim 1, further comprising a second bus connecting the touch driving device to the touch controller,
wherein, during the display period, the touch sensing data is transferred from the touch driving device to the touch controller through the first and second buses.

5. The touch sensing device of claim 1, further comprising a second bus connecting the touch driving device to the touch controller, wherein the ternary-symbol touch sensing data includes first ternary-symbol touch sensing data and second ternary-symbol sensing data, and during the display period, the first ternary-symbol touch sensing data is transferred from the touch driving device to the touch controller through the first bus and the second ternary-symbol touch sensing data is transferred through the second bus.

6. The touch sensing device of claim 1, further comprising a second bus and a third bus, each connecting the touch driving device to the touch controller, wherein the touch driving device comprises a plurality of readout integrated circuits, and the plurality of readout integrated circuits shares at least one of the first to third buses and is connected to the touch controller through the shared at least one bus.

7. The touch sensing device of claim 1, further comprising a second bus and a third bus, each connecting the touch driving device to the touch controller, wherein, during the display period, the touch sensing data is transferred from the touch driving device to the touch controller through the first bus, the second bus, and the third bus.

8. The touch sensing device of claim 1, further comprising a second bus and a third bus connecting the touch driving device to the touch controller, wherein the ternary-symbol touch sensing data includes first ternary-symbol touch sensing data, second ternary-symbol touch sensing data, and third ternary-symbol touch sensing data, and during the display period, the first ternary-symbol touch sensing data is transferred from the touch driving device to the touch controller through the first bus, the second ternary-symbol touch sensing data is transferred from the touch driving device to the touch controller through the second bus, and the third ternary-symbol touch sensing data is transferred from the touch driving device to the touch controller through the third bus.

9. The touch sensing device of claim 1, wherein, during the touch sensing period, the touch driving device and the touch controller are configured to operate in a write mode or a sensing mode, during the display period, the touch driving device and the touch controller are configured to operate in the write mode, a read request mode, or a read operation mode, in the write mode during the touch sensing period or the display period, a setting of the touch driving device is initialized, or write data to be changed is transferred from the touch controller to the touch driving device, in the read request mode, read request data requesting the touch sensing data is transferred from the touch controller to the touch driving device, and in the read operation mode, the touch sensing data is transferred from the touch driving device to the touch controller.

10. The touch sensing device of claim 1, further comprising a second bus connecting the touch driving device to the touch controller, wherein the touch driving device is configured to convert the touch sensing data into first ternary-symbol touch sensing data and second ternary-symbol sensing data, during the display period, the touch driving device and the touch controller are configured to operate in a read request mode or a read operation mode, in the read request mode, a clock is transferred from the touch controller to the touch driving device through the first bus and read request data requesting the touch sensing data is transferred from the touch controller to the touch driving device through the second bus, and in the read operation mode, the first ternary-symbol touch sensing data is transferred from the touch driving device to the touch controller through the first bus and the second ternary-symbol touch sensing data is transferred from the touch driving device to the touch controller through the second bus.

11. The touch sensing device of claim 1, wherein the touch driving device is configured to convert the touch sensing data into first ternary-symbol touch sensing data, second ternary-symbol touch sensing data, and third ternary-symbol touch sensing data, the touch sensing device further comprises a second bus and a third bus, each connecting the touch driving device to the touch controller, during the touch sensing period, the touch driving device and the touch controller are configured to operate in a write mode or a sensing mode, in the sensing mode during the touch sensing period, the touch controller is configured to transfer a touch modulation signal to the touch driving device, during the display period, the touch driving device and the touch controller are configured to operate in a read request mode or a read operation mode, in the read request mode, a clock is transferred from the touch controller to the touch driving device through the first bus and read request data requesting the touch sensing data is transferred from the touch controller to the touch driving device through the second bus, and in the read operation mode, the first ternary-symbol touch sensing data is transferred from the touch driving device to the touch controller through the first bus, the second ternary-symbol touch sensing data is transferred from the touch driving device to the touch controller through the second bus, and the third ternary-symbol touch sensing data is transferred from the touch driving device to the touch controller through the third bus.

12. A driving method of a touch sensing device, the driving method comprising:

receiving touch sensing data from a touch sensor during a touch sensing period by using a touch driving device;

transferring the touch sensing data to a touch controller by using the touch driving device during a display period, wherein the transferring of the touch sensing data to the touch controller during the display period comprises converting the touch sensing data into ternary-symbol touch sensing data by using the touch driving device.

13. The driving method of claim 12, wherein the ternary-symbol touch sensing data includes first ternary-symbol touch sensing data and second ternary-symbol touch sensing data, and the transferring of the touch sensing data to the touch controller during the display period comprises:

transferring, by using the touch driving device, the first ternary-symbol touch sensing data to the touch controller through a first bus and transferring the second ternary-symbol touch sensing data to the touch controller through a second bus.

14. The driving method of claim 12, wherein the ternary-symbol touch sensing data includes first ternary-symbol touch sensing data, second ternary-symbol touch sensing data, and third ternary-symbol touch sensing data, and the transferring of the touch sensing data to the touch controller during the display period comprises:

transferring, by using the touch driving device, the first ternary-symbol sensing data to the touch controller through a first bus, transferring the second ternary-symbol touch sensing data to the touch controller through a second bus and transferring the third ternary-symbol touch sensing data to the touch controller through a third bus.

15. The driving method of claim 12, wherein the transferring of the touch sensing data to the touch controller during the display period comprises:

transferring read request data, requesting the touch sensing data, to the touch driving device by using the touch controller; and transferring the touch sensing data to the touch controller by using the touch driving device.

16. The driving method of claim 15, wherein the transferring of the read request data to the touch driving device comprises transferring, by using the touch controller, a clock to the touch driving device through a first bus and transferring the read request data, requesting the touch sensing data, to the touch driving device through a second bus, and the transferring of the touch sensing data to the touch controller comprises transferring the touch sensing data to the touch controller through the first and second buses by using the touch driving device.

17. The driving method of claim 15, wherein the receiving of the touch sensing data from the touch sensor during the touch sensing period comprises transferring a touch modulation signal to the touch driving device by using the touch controller, the transferring of the read request data, requesting the touch sensing data, to the touch driving device comprises transferring, by using the touch controller, a clock to the touch driving device through a first bus and transferring the read request data, requesting the touch sensing data, to the touch driving device through a second bus, and the transferring of the touch sensing data to the touch controller comprises transferring the touch sensing data to the touch controller through the first and second buses and a third bus by using the touch driving device.

18. The driving method of claim 12, wherein the receiving of the touch sensing data by using the touch driving device during the touch sensing period comprises:

receiving a touch sensing signal from the touch sensor by using the touch driving device;

converting the received touch sensing signal into the touch sensing data; and storing the touch sensing data in the touch driving device, and the transferring of the touch sensing data to the touch controller during the display period comprises transferring the touch sensing data stored in the touch driving device, to the to the touch controller.

* * * * *